United States Patent [19]

Freeman

[11] 4,255,242

[45] Mar. 10, 1981

[54] REFERENCE ELECTRODE IR DROP CORRECTOR FOR CATHODIC AND ANODIC PROTECTION SYSTEMS

[75] Inventor: Jonathan P. Freeman, Dorset, Ohio

[73] Assignee: Freeman Industries, Inc., Dorset, Ohio

[21] Appl. No.: 65,226

[22] Filed: Aug. 9, 1979

[51] Int. Cl.³ .............................................. C23F 13/00
[52] U.S. Cl. ..................................... 204/147; 204/196; 204/231
[58] Field of Search ......................... 204/147, 196, 231

[56] References Cited

U.S. PATENT DOCUMENTS

| | | | |
|---|---|---|---|
| 3,142,631 | 7/1964 | Woodley | 204/147 X |
| 3,362,900 | 1/1968 | Sabins | 204/196 |
| 3,409,526 | 11/1968 | Banks et al. | 204/147 |
| 3,425,921 | 2/1969 | Sudrabin | 204/147 |
| 3,634,222 | 1/1972 | Stephens, Jr. | 204/147 X |
| 4,080,272 | 3/1978 | Ferry et al. | 204/147 |

Primary Examiner—Aaron Weisstuch
Assistant Examiner—D. R. Valentine
Attorney, Agent, or Firm—Craig & Antonelli

[57] ABSTRACT

In making measurements of the potential of a structure immersed in an electrolyte, which structure is being protected from corrosion by a cathodic or anodic protection system, serious errors are often introduced by the IR drop component induced by current flowing between the cathode and anode of the protection system on a reference cell which is used for measurement. To overcome this, a system is provided of the type including means for applying a rectified alternating current voltage between the structure and an electrode which is immersed in the electrolyte and spaced apart from the structure. A direct current reference source is coupled to the structure. A reference cell is located in the electrolyte and spaced apart from the structure. The reference cell is also coupled to means for measuring the potential produced by the reference cell and the structure wherein the measuring means includes means for separating any voltage component of the rectified alternating current at the reference cell from the direct current voltage produced by the reference cell. The measuring means also includes output means for providing an output voltage having only the cell-to-structure potential to indicate the potential of the structure to be protected without interference from the alternating current rectified voltage. This arrangement allows for elimination of the IR drop from the measurement using only a single reference cell for each set of measurements. Further, there is no need for interrupting the cathode to anode current flow or for carefully timing the relationship of the cathode to anode current with the timing of the measurement.

23 Claims, 4 Drawing Figures

REFERENCE ELECTRODE IR DROP CORRECTOR FOR CATHODIC AND ANODIC PROTECTION SYSTEMS

FIELD OF THE INVENTION

The present invention relates generally to cathodic or anodic protection systems, and, more particularly, to a system for eliminating the effect of the IR drop produced by the protective circuitry on a reference cell and measuring unit which determines the potential of the structure being protected.

BACKGROUND OF THE INVENTION

As is well known, metal structures which must be immersed in electrolytes, such as iron or iron alloys in water, are subject to a significant problem of corrosion. This problem occurs due to the flow of local current through the electrolyte between localized cathodic and anodic portions of the immersed structure.

Accordingly, in the past, a number of systems have been developed to counteract this corrosion by making the metal structure to be a protected part of an electrical arrangement which holds the structure at a predetermined electrical potential. This is accomplished by providing an electrode which is also immersed in the electrolyte and spaced apart from the structure to be protected. The structure and the electrode are then coupled to terminals of differing potentials of a direct current voltage source (typically a rectified alternating current voltage). Thus, the structure forms part of a circuit comprised of the voltage source, the electrode, the electrolyte, and the structure itself. This provides a predetermined polarity of potential to the structure to reduce the likelihood of the development of corrosion produced by local current flow.

If the structure is maintained at a negative potential, the system is known as a cathodic protection system. On the other hand, if the structure is maintained at a positive potential, the system is known as an anodic protection system. Of course, in either case, the electrode will have a polarity opposite to that of the structure. Further, in either case, it is desirable to maintain the structure at a predetermined potential to continue to prevent corrosion, since an improper potential level can reduce the effectiveness of corrosion prevention, and, in some cases, actually stimulate the corrosion.

For illustrative purposes, all discussion hereinafter will relate to a cathodic protection system wherein the structure to be protected is a cathode, and the electrode with which it cooperates is an anode. Of course, it is understood that the system discussed herein can readily be converted to an anodic protection system by reversing the polarities of the structure and the electrode.

To hold the structure at a desired potential level, e.g. at a predetermined negative potential for cathodic protection, it is necessary to sense the potential of the structure and make any changes necessary to the rectified alternating current source for correcting the current flow between the cathode and the anode to maintain the desired potential level. Typically, the sensing is done through the use of a reference cell (e.g. a standard Cu-CuSO$_4$ half cell) which is also located in the electrolyte spaced apart from the structure. This reference cell is coupled to a measuring means such as a voltmeter. The measuring means is also coupled to the structure. Therefore, the measuring means can readily determine the potential of the structure. Since it is known that the potential of the structure has to remain at a certain level to be effective to prevent corrosion, the determination of the structure's potential allows control of the voltage applied between the anode and the structure which establishes the potential of the structure. Such control can be manual, or with an automatic adjuster for the rectified alternating current source coupled to the anode and cathode.

A problem which develops in these prior art systems is error in the measurement taken by the measuring means due to the effect of the so-called IR drop. This IR drop is developed by current produced between the anode and the structure. This current develops a voltage $V_{IR}$ at the reference cell proportional to the current between the anode and cathode multiplied by the resistance of the electrolyte and structure coatings. Obviously, as the resistivity of the electrolyte or coating increases, this voltage component $V_{IR}$ becomes more significant. And, since it is not a proper variable for determining the potential of the structure via the reference cell, it can become a source of significant measurement error.

This problem becomes more serious when the reference cell is located close to the anode. Accordingly, attempts have been made in the past to reduce $V_{IR}$ by locating the reference cell near or even on the structure itself as far away as possible from the anode. However, with this arrangement, the reference cell has a reduced portion of structure which it can effectively monitor. Further, it may actually block out a portion of the structure which it is adjacent to, thereby preventing maintenance of the proper negative potential at the blocked-out portion.

One prior art system which seeks to reduce this problem is taught in U.S. Pat. No. 3,425,921 issued to Sudrabin on Feb. 4, 1969. This system uses a pair of reference cells immersed in an electrolyte rather than the conventional single reference cell. This pair of reference cells is located so that the potential drop between one of the reference cells and the structure is greater than the potential drop of the other. These reference cells then form part of a bridge circuit such as shown in FIG. 2 of that patent for controlling the rectified alternating current source. This arrangement allows a reading of the desired polarization potential of the structure without interference from the IR drop. Although this arrangement does reduce measurement error caused by the IR drop, it is somewhat inconvenient in requiring the use of an extra reference electrode for each measuring location.

Other prior art systems have also been developed to offset the effect of the IR drop. For example, in U.S. Pat. No. 3,634,222 issued to Stephens, Jr. on Jan. 11, 1972, the current between the anode and the cathode is turned off each time a reference reading is to be taken. In U.S. Pat. No. 4,080,272 issued to Ferry et al on Mar. 21, 1978, the reference reading is taken at a zero direct current output point of the full-wave rectified alternating current. These systems also improve the measurement accuracy. However, they both require a specific timed relationship between the current flow between the anode and the cathode and the reference reading taken which, in turn, requires a somewhat complicated circuit arrangement to maintain this specific timed relationship.

SUMMARY OF THE INVENTION

Accordingly, it is an object of the present invention to provide an improved protection system of either the cathodic or anodic type for structures which are immersed in an electrolyte.

It is a further object of the present invention to provide an improved system for monitoring the potential of a protected structure by eliminating the effect of the IR drop on the measurement.

Another object of the present invention is to provide an improved system for monitoring the potential of a protected structure using only a single reference cell, while eliminating the effects of the IR drop without the need for locating the electrode close to the structure to be protected.

Still another object of the present invention is to provide an improved system for monitoring the potential of a protected structure which can measure the potential of the structure simultaneously with the application of current between the anode and cathode without the need for establishing a specific time relationship between the reference cell measurement and the anode-cathode current while eliminating the effects of the IR drop.

To achieve these and other objects, the present invention provides a method and apparatus for protecting structures immersed in an electrolyte wherein a rectified alternating current voltage is applied between the structure and an electrode which is also immersed in the electrolyte and spaced apart from the structure. A reference cell is located in the electrolyte and spaced apart from the structure. Measuring means are coupled to this reference cell to measure the potential produced by the reference cell. This measuring means includes means for separating any voltage component of the rectified alternating current produced at the reference cell from the direct current voltage produced at the reference cell by the structure potential. The measuring means also includes an output means for providing only the structure potential component as the output indication of the potential of the structure to be protected. Thus, the output measurement is free from any interference by the rectified alternating current voltage.

BRIEF DESCRIPTION OF THE DRAWINGS

Other objects and advantages of the present invention may be more clearly understood by reference to the following detailed description and drawings wherein.

DETAILED DESCRIPTION OF THE INVENTION

Figure 1A:
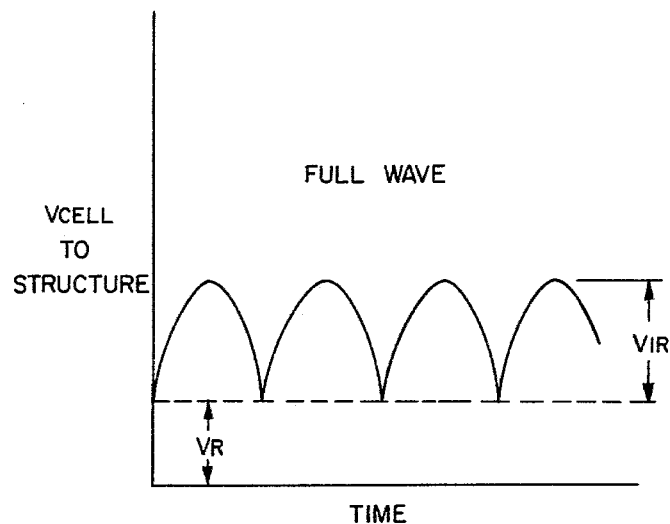
FIGS. 1a, 1b shows waveforms to illustrate the basic principal of operation of the present invention.
Figure 1B:
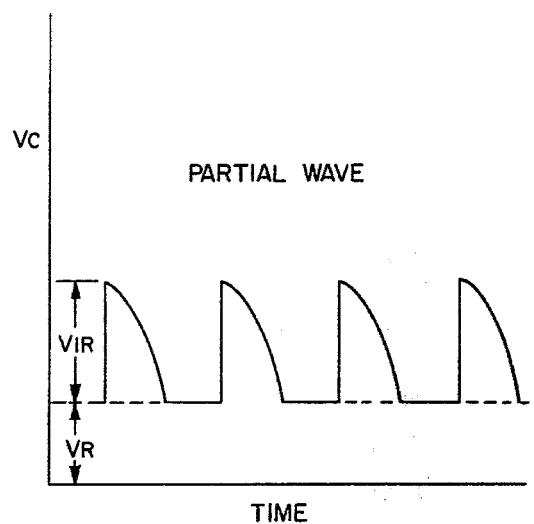

Referring now to the drawings, FIGS. 1a and 1b show waveforms for illustrating the basic principle of operation of the present invention respectively for a full-wave rectified alternating current voltage and a partial-wave rectified alternating current voltage being applied between an anode and a cathodic structure. In these figures, the voltage between a reference cell and the structure (i.e. the cathode in a cathodic protection system ($V_c$ is shown to be a combination of the reference cell voltage component $V_R$ and an induced IR drop voltage $V_{IR}$. The voltage $V_R$ is the cell-to-structure potential and represents the desired parameter to be measured. The voltage $V_{IR}$ is produced by the rectified alternating current between the anode and cathode structure.

The principle of operation of the present invention is to separate the $V_{IR}$ voltage from the $V_R$ voltage. The remaining $V_{IR}$ component is then compared with the potential at the reference cell, which comprises $V_R$ and $R_{IR}$, so that $V_{IR}$ can be cancelled out.

Figure 2:
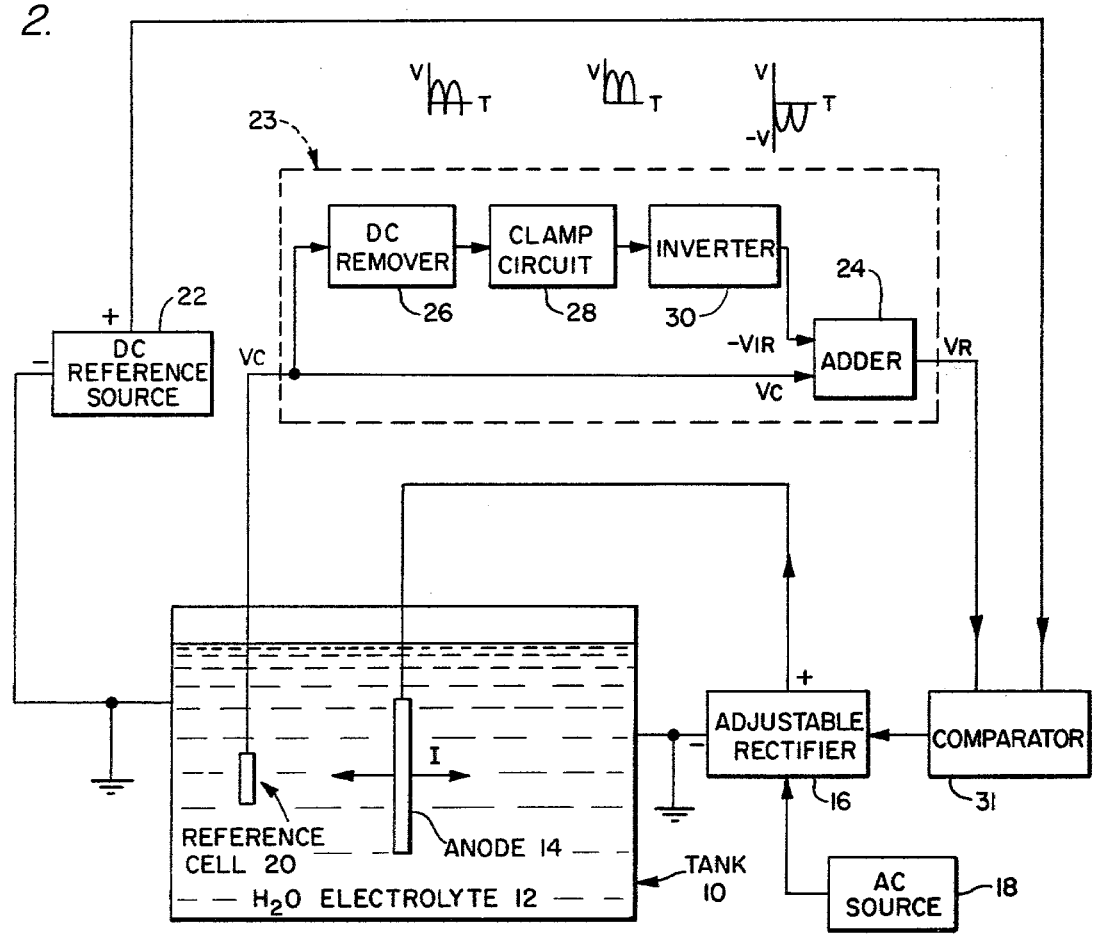
FIG. 2 shows a diagram of the present invention with the circuit in block diagram form.

Referring now to FIG. 2, a preferred embodiment for carrying out this operation is shown for a cathodic protection system. The structure to be protected here is shown as a tank 10 which acts as a cathode filled with an electrolyte 12 such as water. An anode 14 is inserted in the electrolyte 12. The anode 14 and the tank 10 are coupled, respectively, to the positive and negative output terminals of an adjustable rectifier 16. This adjustable rectifier 16 produces either a full-wave or a partial-wave rectified alternating current signal from the unrectified output of an alternating current source 18. A reference cell 20 is also inserted in the electrolyte 12. The reference cell 20 generates a potential $V_c$ shown in FIG. 2 and is the same as that shown in FIG. 1 in being a combination of the reference cell voltage $V_R$ and the undesired IR drop $V_{IR}$ which is a voltage induced at the cell 20 as a function of the current between the anode 14 and the tank 10 and the resistivity of the electrolyte 12.

To correct the error caused by the IR drop voltage $V_{IR}$, the present invention provides a correction circuit 23 comprising an adder 24, a DC remover 26, a clamp circuit 28, and an inverter 30. The potential $V_c$ is applied to one input terminal of the adder 24. The voltage $V_c$ is also coupled to the DC remover 26 which removes $V_R$ leaving only $V_{IR}$. The output of the DC remover 26 is coupled to the clamp 28 which serves to clamp $V_{IR}$ at 0 volts. This clamped $V_{IR}$ then is inverted by the inverter 30.

The clamped and inverted $V_{IR}$ signal is then applied to the second input terminal of the adder 24. Thus, the output of the adder 24 will be $V_R$ since the addition of $V_c$ which equals $V_R + V_{IR}$ with the inverted $V_{IR}$ will cancel out $V_{IR}$. Alternatively, $V_c$ could be inverted and added to a clamped but non-inverted $V_{IR}$ to cancel out $V_{IR}$ and give an output of negative $V_R$. In either case, the output of $V_R$ can be used to control the adjustable rectifier 16 to maintain the desired potential of the tank 10 without error caused by $V_{IR}$. This control is accomplished by comparing the output $V_R$ of the correction circuit 23 with a reference voltage from a DC reference source 22 in a comparator 31 to generate an error signal based on the difference between $V_R$ and the reference source signal. This error signal is then used to control the adjustable rectifier 16.

Figure 3:
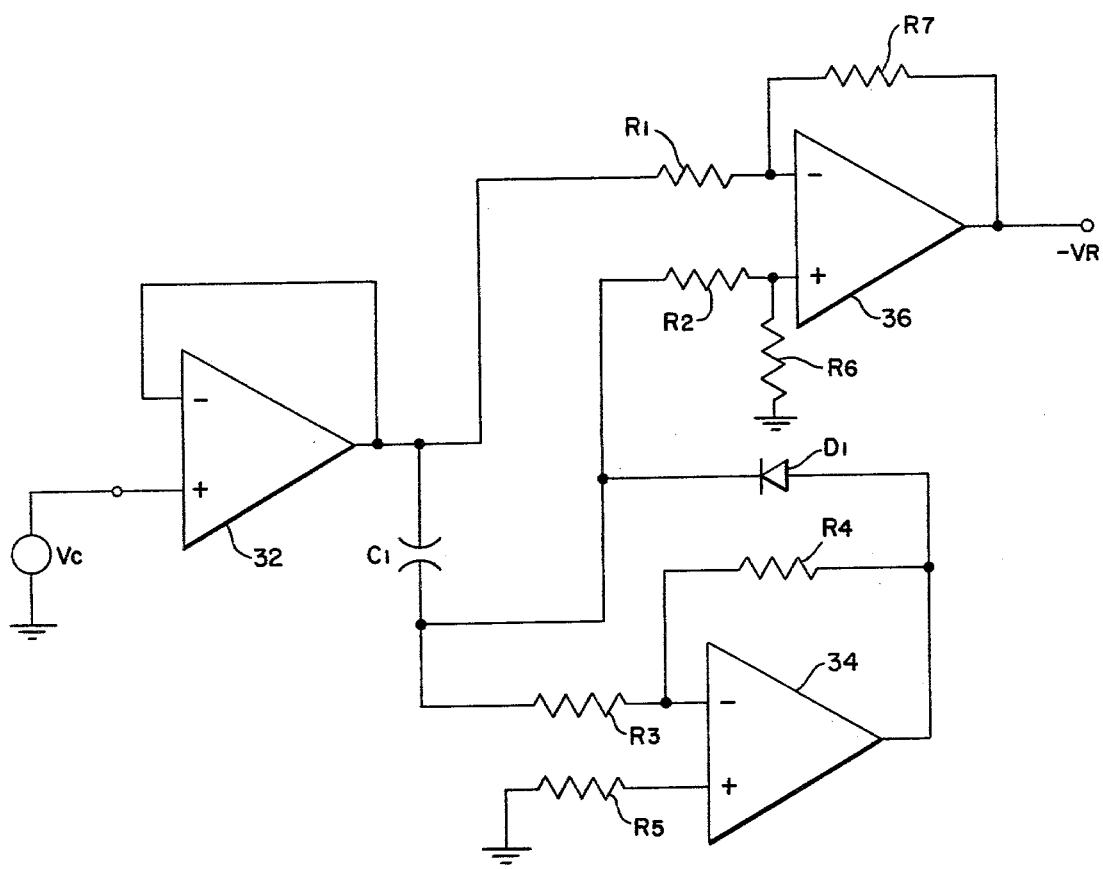
FIG. 3 shows a detailed schematic circuit for one embodiment of a corrector circuit for eliminating the IR drop in accordance with the present invention.

FIG. 3 shows in detail one specific embodiment for a correction circuit 23 for use in the present invention. In FIG. 3, $V_c$ is applied to the positive input terminal of a first differential amplifier 32 having feedback of its output coupled to its negative input terminal. This first differential amplifier 32 acts as a voltage follower to isolate the signal $V_c$ from the other circuits of the system.

The output of the first differential amplifier 32 is then applied to the negative input of a second differential amplifier 36 through a resistance $R_1$ and to a capacitor $C_1$ which serves as the DC remover leaving only the voltage component of $V_{IR}$. The output of the capacitor $C_1$ is coupled to the positive terminal of the second differential amplifier 36 through a resistor $R_2$. In addition, the output of the capacitor $C_1$ is also applied to the negative input terminal of a third differential amplifier 34 through a resistor $R_3$. Feedback of the output of the third differential amplifier 34 through a resistor $R_4$ is also applied to the negative terminal of the amplifier 34. The positive terminal of the third differential amplifier 34 is coupled to ground through a resistor $R_5$ which can equal 0. This third differential amplifier 34 serves to clamp the signal $V_{IR}$ to zero voltage.

The output of the third differential amplifier 34 is coupled to the positive terminal of the second differential amplifier 36 through a diode $D_1$ and a resistor $R_2$. A resistor $R_6$ is also coupled to the positive terminal of the second differential amplifier 36 while feedback is provided to a negative terminal of the amplifier 36 through a resistor $R_7$.

In operation, the output of the second differential amplifier 36 adds $-V_c$ to the clamped positive $V_{IR}$ signal. This will cancel out $V_{IR}$ and leave an output of $-V_R$. This output can then be used to control the adjustable rectifier 18 as discussed above.

The adjustable rectifier 16 can be made with a number of known circuit arrangements. The above-discussed U.S. Pat. No. 3,425,921 shows one possible arrangement for such an AC source and rectifier using a motor controlled by the output reading $V_R$ to adjust the inductance in the line of the AC source. Of course, other automatic adjustment arrangements could be used. Alternatively, one could simply provide a meter to read $V_R$ after $V_{IR}$ is removed, and then set the AC source 18 manually.

Similarly, the DC reference source 22 could be any known arrangement for providing a controllable direct current level without significant variations of this level. One arrangement for this would be a battery with adjustable resistors such as shown in U.S. Pat. No. 3,425,921. Of course, other alternatives are readily available. Also, the reference cell 20 can be made of known elements such as the standard $Cu-CuSO_4$ half-cell.

In this regard, it is noted further that although FIG. 2 shows the correction circuit 23 as being external to the electrolyte 12, it could be provided in a common housing with the reference cell 20 thereby being submersed in the electrolye 12 to reduce induced signals. Further, although FIG. 2 shows the reference cell 20 as being spaced apart from the tank 10, it is to be understood that it could be located adjacent to the tank or even fixed on the tank as long as arrangements are made to ensure that a potential exists between the tank and the reference cell.

Although FIGS. 2 and 3 show specific arrangements for cancelling out $V_{IR}$, obviously a number of modifications of these particular elements are possible. Similarly, it is understood that the system is not limited to a single anode as shown, but may be applied as well to a system with several anodes (or cathodes).

It is also to be understood that the present invention is not intended to be limited to iron or iron alloys structures immersed in water, but may be applied equally well to a large number of metals immersed in various electrolytes. It is noted that the term immersed here has been used to generally describe both containers actually holding the electrolyte, such as shown in FIG. 2, and cathodes or anodes which would actually be submersed in an electrolyte.

Also, as mentioned above, although the system has been described here in conjunction with a cathodic protection system, it is understood that the system could readily be used for anodic protection by changing the appropriate polarities of the connections to the voltage sources so the tank potential is maintained at a positive potential rather than a negative potential. Also, the system could be used as a monitor rather than as a complete control system in those situations where monitoring the voltage level is sufficient.

As mentioned above, one of the advantages of the present system is that only a single reference cell is required to take a set of measurements. Obviously, in a large structure, it might be desirable to provide reference cells at different locations to sense the potentials of the structure in different areas. Therefore, in using the term "single reference cell" this is only intended to mean that only one reference cell is necessary for each set of readings taken, rather than requiring a pair of reference cells for each set of readings as was done in the aforementioned U.S. Pat. No. 3,425,921.

Also, it is to be understood that the term "direct current component" only refers to the term $V_R$, and not the overall cell voltage which includes both $V_R$ and a direct current level of the rectified voltage $V_{IR}$.

It is to be understood that the above-described arrangements are simply illustrative of the application of the principals of this invention. Numerous other arrangements may be readily devised by those skilled in the art which embody the principles of the invention and falls within its spirit and scope.

I claim:

1. A system to protect a structure immersed in an electrolyte comprising:
    means to apply a rectified alternating current voltage between the structure and an electrode which is immersed in the electrolyte and spaced apart from the structure;
    a reference cell located in the electrolyte to produce a direct current voltage between the reference cell and the structure; and
    means coupled to the reference cell to measure the potential produced by the reference cell between the reference cell and the structure, said measuring means including means to separate out any alternating current voltage component of the rectified alternating current voltage induced at the reference cell by a current flowing between the electrode and the structure from a direct current voltage component produced by the reference cell between the cell and the structure, and output means to provide only the direct current voltage component as the output of said measuring means to indicate the potential of the structure to be protected without interference from a voltage produced by the current flow between the electrode and the structure.

2. A system according to claim 1, wherein the rectified alternating current voltage is applied so that the electrode is positive with respect to the structure whereby the electrode is an anode and the structure is a cathode.

3. A system according to claim 1, wherein the rectified alternating current voltage is applied so that the electrode is negative with respect to the structure so that the electrode is a cathode and the structure is an anode.

4. A system according to claim 1, wherein the means for separating the voltage components comprises a direct current remover for allowing the alternating current component to pass there-through while removing the direct current component.

5. A system according to claim 4, wherein the output means includes means for comparing the voltage induced at the reference cell which includes both the alternating current component and the direct current component with the alternating current component at the output of the direct current remover to cancel out the alternating current component.

6. A system according to claim 4, wherein the direct current remover is a capacitor.

7. A system according to claim 5, wherein the comparator is an adder and wherein the output means further includes an inverter coupled between the direct current remover and the adder to invert the alternating current component applied to the adder.

8. A system according to claim 5, wherein the comparator is a differential amplifier having the potential of the reference cell coupled to a first input terminal thereof and the alternating current component coupled to a second input terminal thereof of opposite polarity from the first input terminal.

9. A system according to claim 1, wherein the rectified alternating current voltage is a full-wave rectified alternating current voltage.

10. A system according to claim 1, wherein the rectified alternating current voltage is a partial-wave rectified alternating current voltage.

11. A system according to claim 1, wherein the output of the measuring means is coupled to the means for applying the rectified alternating current voltage to control the rectified alternating currrent voltage in accordance with the output of the measuring means.

12. A system according to claim 1, wherein the reference cell and the measuring means are located in a common housing, said housing being immersed in the electrolyte.

13. A system according to claim 1, wherein said measuring means further comprises a comparator having a first input coupled to the output means and a second input coupled to a direct current reference voltage source.

14. A cathodic protection system to protect a structure immersed in an electrolyte comprising:
an alternating current source;
a rectifier, coupled to the alternating current source, to provide a rectified alternating current voltage, said rectifier having a positive and negative output terminal;
means for coupling the structure to be protected to the negative output terminal of the rectifier;
an anode located in the electrolyte and spaced apart from the structure;
means for coupling the anode to the positive output terminal of the rectifier so that a circuit is formed between the anode and the structure to apply a negative potential to the structure;
a single reference cell located in the electrolyte spaced apart from the structure; and
means coupled to the reference cell and the structure to measure a potential $V_c$ at the reference cell, wherein $V_c$ is the sum of a reference voltage $V_R$ established by the cell-to-structure potential induced by the reference cell and the voltage $V_{IR}$ which is an alternating current voltage component established by the rectified alternating currrent flowing from the anode to the structure multiplied by the resistance of the electrolyte, said measuring means including means for separating $V_{IR}$ from $V_R$, and output means to provide $V_R$ as the output of the measuring means to indicate the negative potential of the structure to be protected without interference from $V_{IR}$.

15. A system according to claim 14, wherein the output of the measuring means is coupled to the alternating current source to control the alternating current source in accordance with the signal $V_R$.

16. A system according to claim 1 or 14, wherein the alternating current voltage component comprises a fluctuating voltage which periodically varies between a maximum and minimum value.

17. A method to protect structures immersed in an electrolyte comprising:
applying a rectified alternating current voltage between the structure and an electrode immersed in the electrolyte and spaced part from the structure to produce a rectified alternating current flow between the electrode and the structure;
applying a direct current voltage by a reference cell located in the electrolyte to produce a direct current potential between the reference cell and the structure simultaneously with the production of the rectified alternating current flow between the electrode and the structure;
sensing both any alternating current voltage component produced at the reference cell by the rectified alternating current flow and the direct current component produced by the reference cell;
separating the alternating current voltage component produced by the rectified alternating current from the direct current voltage component; and
providing an output signal comprising only the direct current voltage component.

18. A method according to claim 17, wherein the rectified alternating current voltage is applied so that the electrode is positive with respect to the structure to form a cathodic protection system.

19. A method according to claim 17, wherein the rectified alternating current voltage is applied so that the electrode is negative with respect to the structure to form an anodic protection system.

20. A method according to claim 17, wherein the step of providing an output comprises comparing the alternating current component and the direct current component at said reference cell with the alternating current component after it has been separated from the direct current component.

21. A method according to claim 20, further comprising making said comparison after the separated alternating current component has been inverted.

22. A method according to claim 20, wherein the step of comparing comprises applying the alternating current component to one input terminal of a differential amplifier and applying both the alternating current component and the direct current component to a second input terminal of the differential amplifier having an opposite polarity from the first input terminal thereof.

23. A method according to claim 17, wherein the alternating current voltage component comprises a fluctuating voltage which periodically varies between a maximum and minimum value.

* * * * *